United States Patent [19]

Heep et al.

[11] Patent Number: 5,606,481

[45] Date of Patent: Feb. 25, 1997

[54] OVERVOLTAGE PROTECTION FOR BATTERY POWERED EQUIPMENT

[75] Inventors: Jerry J. Heep, Weatherford, Tex.; Douglas R. Curtis, Los Gatos, Calif.

[73] Assignee: Tandy Corporation, Ft. Worth, Tex.

[21] Appl. No.: 311,904

[22] Filed: Sep. 26, 1994

Related U.S. Application Data

[63] Continuation of Ser. No. 858,580, Mar. 27, 1992, abandoned.

[51] Int. Cl.$^6$ .................................................... H02H 9/04
[52] U.S. Cl. ............................ 361/56; 361/91; 361/111; 361/118
[58] Field of Search ........................... 56/361; 119/361; 91/361; 361/111, 118

[56] References Cited

U.S. PATENT DOCUMENTS

| | | | |
|---|---|---|---|
| 4,438,498 | 3/1984 | Sekel et al. | 364/483 |
| 4,458,197 | 7/1984 | Robinson | 324/73 |
| 4,492,916 | 1/1985 | Johnson | 324/60 |
| 4,563,770 | 1/1986 | Lemelson et al. | 381/51 |
| 4,608,532 | 8/1986 | Ibar et al. | 324/73 |
| 4,630,162 | 12/1986 | Bell et al. | 361/56 |
| 4,736,327 | 4/1988 | Power | 364/481 |
| 4,794,383 | 12/1988 | Havel | 340/704 |
| 4,864,512 | 9/1989 | Coulson et al. | 364/481 |

*Primary Examiner*—A. D. Pellinen
*Assistant Examiner*—S. Jackson
*Attorney, Agent, or Firm*—Stephen S. Mosher

[57] ABSTRACT

An overvoltage protection circuit for a CMOS electronic multimeter circuit uses a pair of complementary field-effect protection transistors connected to each input line of the meter circuit. The gate electrodes of the protection transistors are connected to bias voltage sources which provide bias voltages with magnitudes slightly less than the meter power supply voltages. The protection transistors go into conduction when an overvoltage condition causes the voltage on the input to exceed the bias voltages and the conducting protection transistors clamp the input voltage to substantially the bias voltage. Current caused by an overvoltage condition is shunted to ground thereby avoiding a charging condition in the power supplies.

23 Claims, 3 Drawing Sheets

OVERVOLTAGE PROTECTION FOR BATTERY POWERED EQUIPMENT

This is a continuation of U.S. patent application Ser. No. 07/858,580, for OVERVOLTAGE PROTECTION FOR BATTERY POWERED EQUIPMENT, filed on Mar. 27, 1992, and now abandoned.

FIELD OF THE INVENTION

This invention relates generally to overvoltage protection in solid state equipment, and, more particularly, to an overvoltage protection circuit for use with battery powered equipment.

BACKGROUND OF THE INVENTION

In many electronic apparatus, such as multimeters, externally generated voltages are applied to the apparatus for processing or analysis thereof. In the case of a multimeter, voltages of various magnitudes are coupled to the meter input for measurement. Typically, if the input voltage exceeds the potential of the power supply, the input voltage is clamped to the most positive and the most negative power supply rails in the apparatus. However, in battery powered apparatus, such as multimeters, clamping excessive voltages to the supply rails can be undesirable and even dangerous. In particular, if the multimeter is implemented, in whole or part, as an integrated circuit, the voltage tolerance is very low, on the order of less than 10 volts. Excessive voltages can destroy integrated circuit elements, requiring repair or, often, complete replacement.

FIG. 1 illustrates a prior art overvoltage protection circuit 10A for use with a battery-powered apparatus. In circuit 10A, a diode 18 is coupled between input terminal 14 and positive power supply 22. A diode 20 is similarly coupled between input terminal 14 and negative power supply 24. An input voltage, $V_{IN}$, from an external voltage source 12, is coupled to diodes 18 and 20 through input terminal 14 and input resistor 16. When $V_{IN}$ is greater than the positive power supply voltage, $V_{DD}$, by at least the threshold voltage of diode 18, diode 18 begins to conduct current to the positive power supply 22, effectively charging the power supply. Similarly, when $V_{IN}$ is less than the negative power supply voltage, $V_{SS}$, by at least the threshold voltage of diode 20, diode 20 begins to conduct current from negative power supply 24, effectively charging the negative power supply. For an electronic apparatus powered by non-alkaline batteries, such a result is acceptable. However, if the apparatus is powered by alkaline batteries, even a minute charging current, typically hundreds of microamps, will cause the alkaline batteries to generate hydrogen gas. The formation of such hydrogen gas can be very dangerous and creates both a fire and explosion hazard.

In order to overcome this difficulty, prior art circuits have used a pair of Zener diodes connected in series with reverse polarity as shown in circuit 10B of FIG. 1B. In circuit 10B, an input voltage, $V_{IN}$, from an external voltage source 12, is coupled to an electrical device through input terminal 14 and input resistor 16 in a manner similar to that shown in FIG. 1A. Zener diodes 26 and 28 are connected from input resistor 16 to ground. If a positive input voltage exceeds the reverse breakdown voltage or Zener voltage of Zener diode 26, this diode begins reverse conduction. In this configuration, Zener diode 28 is forward-biased and so the positive input voltage is clamped to ground and cannot exceed the Zener voltage of diode 26.

In a similar manner, if a negative input voltage exceeds the Zener voltage of Zener diode 28, this diode begins reverse conduction. In this configuration, Zener diode 26 is forward-biased and so the negative input voltage is clamped to ground and cannot exceed the Zener voltage of diode 28.

This configuration has the advantage that the current which is generated as a result of an overvoltage condition is shunted to ground rather than the power supply. The circuit thus avoids the battery charging problems associated with the previous prior art circuit. However, when the double Zener diode circuit is used with high-impedance circuits such as CMOS circuits, the Zener clamp circuit can heavily load the input. This loading is the result of the relatively high reverse leakage current normally found in Zener diodes. This high reverse leakage current appears as a stray impedance connected across the input to ground. In the case of a multimeter circuit, this stray impedance appears as a shunt resistance and can cause errors in the readings taken with the meter.

Accordingly, a need exists for a way to safely protect an electronic apparatus from excessive voltages applied to its inputs.

It is, therefore, an object of the present invention to provide an overvoltage protection circuit which can safely shunt excessive input voltages.

Another object of the present invention is to provide an overvoltage protection circuit suitable for use with battery-powered electronic apparatus.

Yet another object of the present invention is to provide an overvoltage protection circuit which shunts current produced by an overvoltage condition to ground.

A further object of the present invention is to provide an overvoltage protection circuit which can be used with high-impedance circuitry.

Still a further object of the present invention is to provide an overvoltage protection circuit which has low leakage when in the non-conducting state.

BRIEF SUMMARY OF THE INVENTION

The above and other object are achieved in accordance with the present invention which, according to one embodiment, provides an overvoltage protection circuit comprising a first bias voltage source for supplying a control voltage which is less than or equal to the power supply voltage and a current amplifier having a first terminal coupled to the input terminal, a second terminal coupled to a potential less than the control voltage and a control terminal coupled to the first bias voltage source for controlling the conduction between the first and second terminals.

In one embodiment, the current amplifier comprises a p-channel field effect transistor having its source terminal coupled to the input terminal and its drain terminal coupled to ground. The field effect transistor shunts excessive input voltages to ground when the input voltage has a greater potential than the control voltage applied to its gate terminal. Alternately, the p-channel field effect transistor may be replaced with a bipolar PNP transistor to achieve the same functionality.

In an embodiment in which both positive and negative DC power supplies are present, a second bias voltage source is included for supplying a control voltage having greater than or equal potential to the negative power supply voltage. A second current amplifier operates in a complementary, opposite manner to shunt excessive negative voltages present at the input terminal of the circuit back through the input terminal. The second current amplifier may be implemented with either an n-channel field effect transistor or a bipolar NPN transistor.

The foregoing and other features, objects and advantages of the invention will be more fully understood by reading the detailed description below in conjunction with the drawings.

DETAILED DESCRIPTION

Figure 1A:
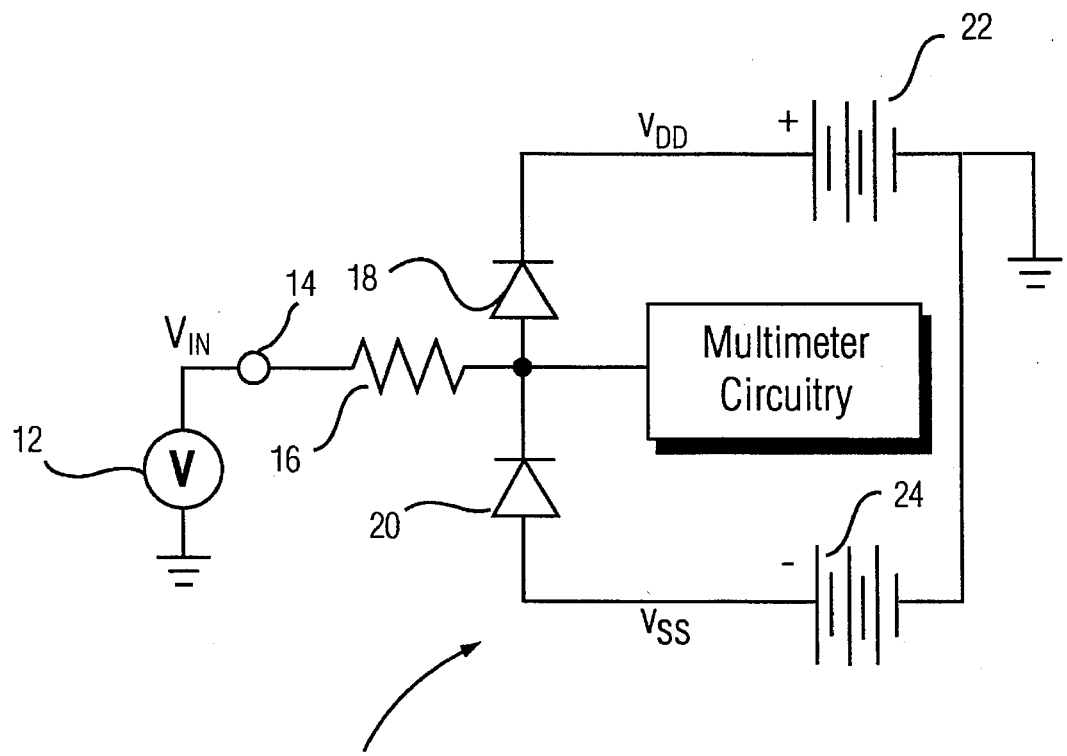
FIG. 1A is a schematic diagram of a prior art diode overvoltage protection circuit.
Figure 1B:
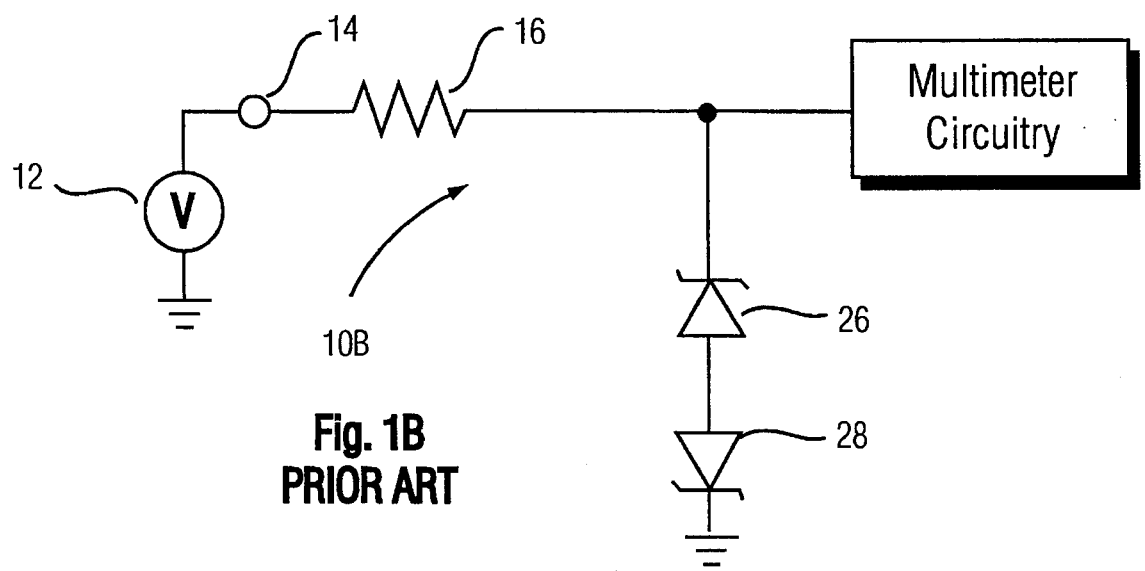
FIG. 1B is a schematic diagram of a prior art Zener diode overvoltage protection circuit.
Figure 2:
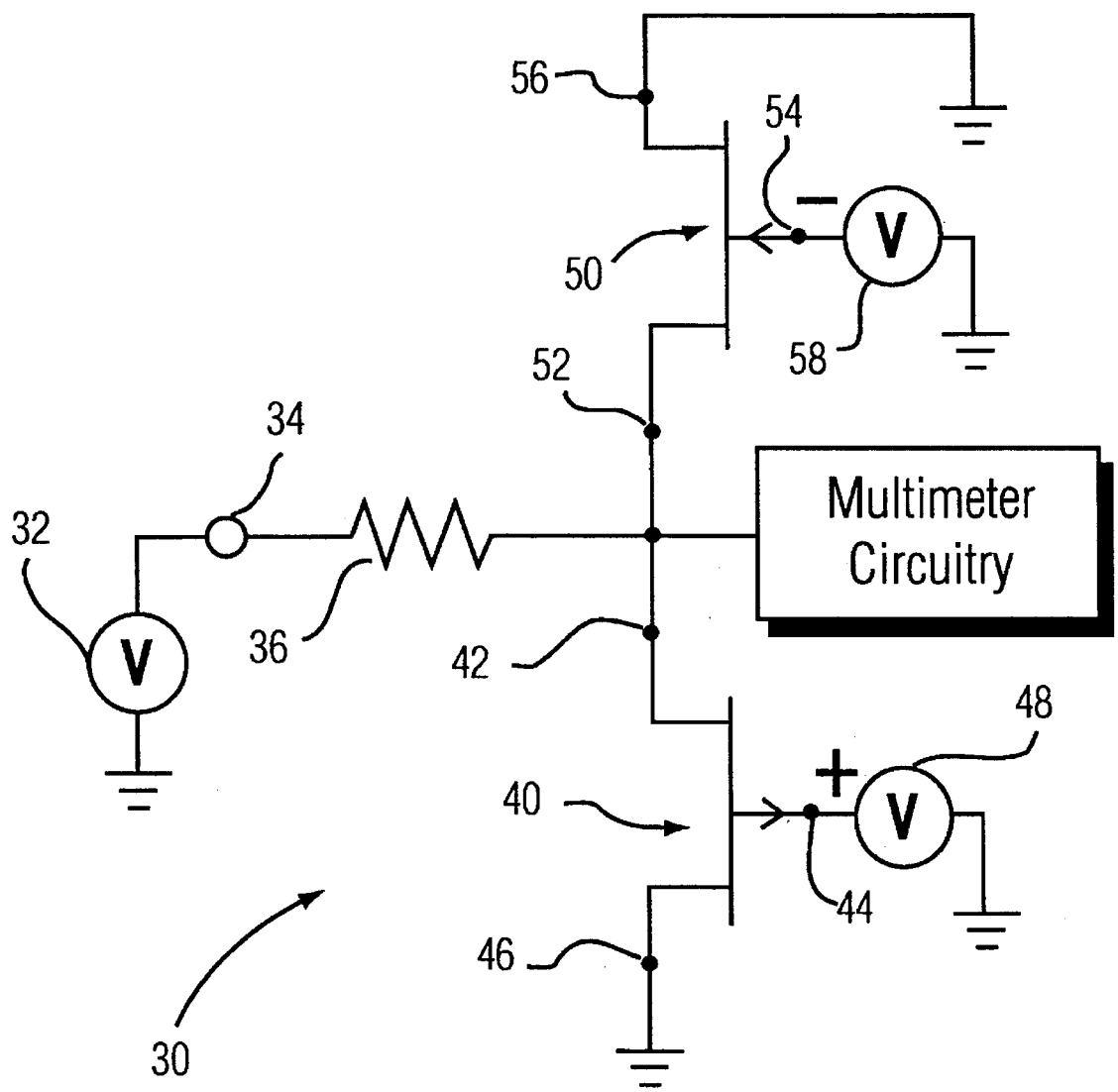
FIG. 2 is a schematic diagram of an overvoltage protection circuit according to a first embodiment of the present invention.

With reference to the drawings, and more particularly FIG. 2 thereof, an overvoltage protection circuit 30 in accordance with a first embodiment of the present invention is illustrated. Circuit 30 comprises an input terminal 34, an input resistor 36, a p-channel Field Effect Transistor (FET) 40, an n-channel FET 50, a first bias voltage source 48, and a second bias voltage source 58. For the purposes of clarity, the source, gate and drain terminals of FET 40 will be designated 42, 44, and 46, respectively. Similarly, the source, gate and drain terminals of FET 50 will be designated 52, 54 and 56, respectively.

As illustrated in FIG. 2, source 42 of FET 40 is coupled to input terminal 34 through input resistor 36. Gate 44 of FET 40 is coupled to bias voltage source 48, as illustrated. Bias voltage source 48 supplies a voltage to gate 44 which may be less than or equal to the positive power supply (not shown), $V_{DD}$. Bias voltage source 48 can be implemented in any number of conventional ways. For example, source 48 may comprise a voltage dividing network of resistors within the multimeter or electronic apparatus which is coupled to the positive power supply. Accordingly, the construction and implementation of the bias voltage source does not form any part of this invention. Drain 46 of FET 40 is coupled to ground, as illustrated.

In a similar manner, source 52 of FET 50 is coupled to input terminal 34 through input resistor 36. Gate 54 of FET 50 is coupled to bias voltage source 58, as illustrated. Bias voltage source 58 supplies a voltage to gate 54 which may be greater than or equal to the negative power supply (not shown), $V_{SS}$. Bias voltage source 58 can be implemented similar to source 48 or in any number of conventional ways. Accordingly, the construction and implementation of bias voltage source 58 does not form any part of this invention. Drain 56 of FET 50 is coupled to ground, as illustrated.

The value of input resistor 36 should be chosen to protect FETs 40 and 50 from being destroyed by excessive current at input terminal 34. External voltage source 32 is connected to input terminal 34 and may either be an AC or DC voltage source.

Circuit 30 operates as follows. When an input voltage, received at input terminal 34, causes source 42 of FET 40 to be at a greater potential than the biasing voltage at gate 44, FET 40 will begin to conduct current and shunt the input voltage to ground through drain 46. In this manner, excessive voltage harmful to source 48, which is connected to a voltage dividing network of resistors in a multimeter, is shunted to ground, preventing damage to the network and the multimeter. In this manner, FET 40 functions as a current amplifier. If the bias voltage at gate 44 is maintained at slightly less than or equal to the positive power supply voltage, $V_{DD}$, any input voltage greater than $V_{DD}$ will be shunted to ground through FET 40. Drain 46 may alternately be coupled to the negative power supply, $V_{SS}$. However, this configuration is less desirable.

Similarly, when an input voltage, received at input terminal 34, causes source 52 of FET 50 to be at a lower potential than the biasing voltage at gate 54, FET 50 will begin to conduct current and shunt the negative input voltage to input terminal 34. In this manner, FET 50 likewise acts as a current amplifier. If the bias voltage at gate 54 is maintained at slightly greater than or equal to the negative power supply voltage, $V_{SS}$, any input voltage less than $V_{SS}$, will be shunted back to input terminal 34 of circuit 30. Drain 56 may alternately be coupled to the positive power supply, $V_{DD}$. Again, however, this configuration is less desirable.

Since, in a majority of instances, excessive voltages applied to an apparatus will be positive and not negative, FET 50 and bias voltage source 58 may be optionally removed from circuit 30. Similarly, if overvoltage protection is required for only negative input voltages, FET 40 and bias voltage source 48 may be optionally removed from circuit 30. In the disclosed embodiment, circuit 30 contains complementary FETs which may be implemented using complementary metal oxide semiconductor (CMOS) fabrication technology.

Figure 3:
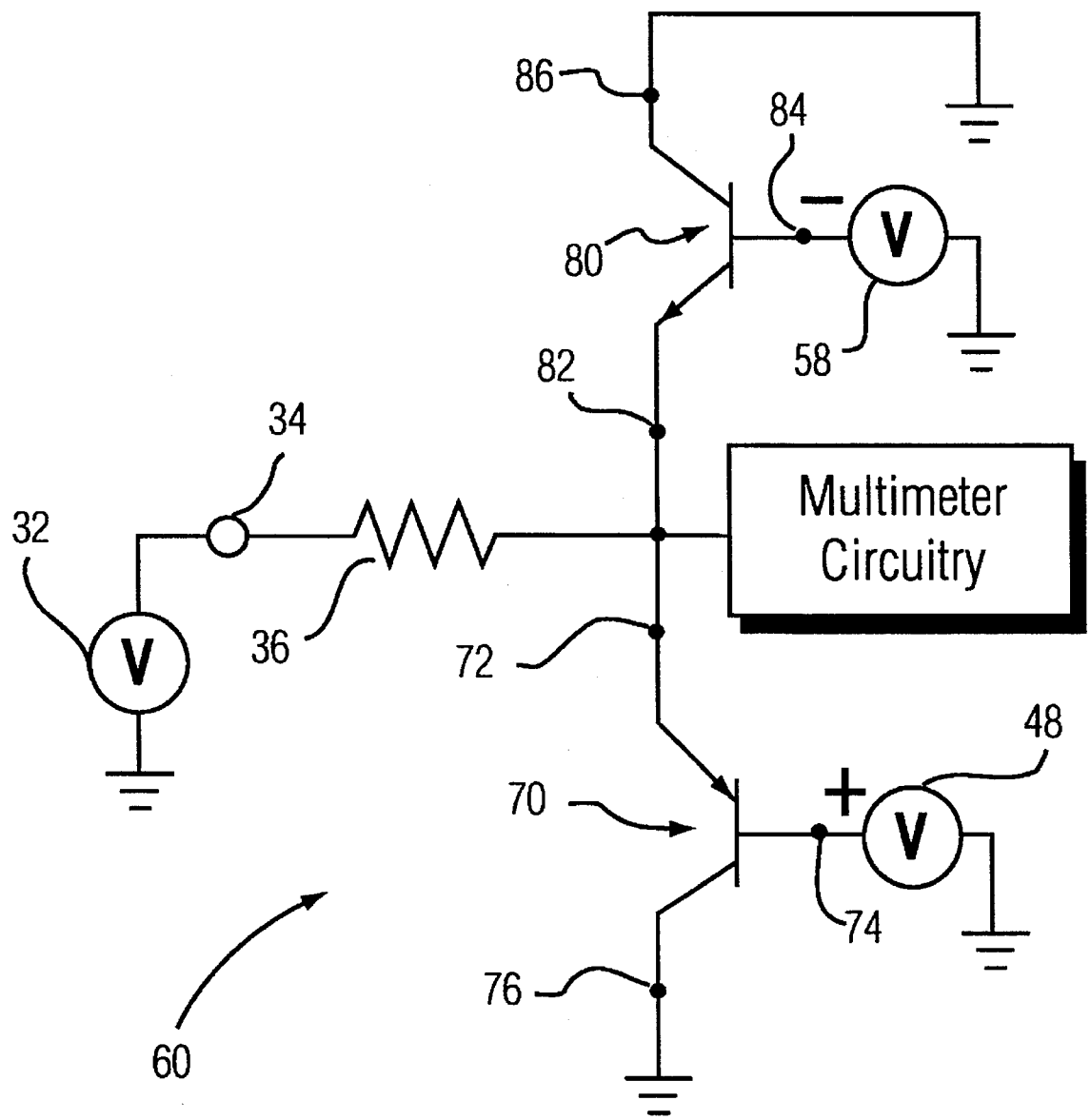
FIG. 3 is a schematic diagram of an overvoltage protection circuit according to a second embodiment of the present invention.

An overvoltage protection circuit 60, in accordance with a second embodiment of the present invention, is illustrated in FIG. 3. Circuit 60 is similar in construction and function to circuit 30 except that FET 40 has been replaced with a bipolar PNP transistor 70 and FET 50 has been replaced with a bipolar NPN transistor 80. For the purposes of clarity, the emitter, base and collector terminals of transistor 70 will be designated 72, 74 and 76, respectively. Similarly, the emitter, base and collector terminals of transistor 80 will be designated 82, 84 and 86, respectively.

As illustrated in FIG. 3, emitter 72 of transistor 70 is coupled to input terminal 34 through input resistor 36. Base 74 of transistor 70 is coupled to bias voltage source 48, as illustrated. As in the first embodiment, bias voltage source 48 supplies a voltage to base 74 which may be less than or equal to the positive power supply source, $V_{DD}$. Collector 76 of transistor 70 is coupled to ground, as illustrated.

In a similar manner, emitter 82 of transistor 80 is coupled to input terminal 34 through input resistor 36. Base 84 of transistor 80 is coupled to bias voltage source 58, as illustrated. As in the first embodiment, bias voltage source 58 supplies a voltage to base 84 which may be greater than or equal to the negative power supply source, $V_{SS}$. Collector 86 of transistor 80 is coupled to ground, as illustrated. In this embodiment, the value of input resistor 36 should be chosen to protect transistors 70 and 80 from being destroyed by excessive current at input terminal 34.

Circuit 60 operates as follows. When an input voltage, received at input terminal 34, causes emitter 72 of transistor 70 to be at a greater potential than the biasing voltage at base 74, transistor 70 will begin to conduct current and shunt the input voltage to ground through collector 76. As in the embodiment of FIG. 2, excessive voltage harmful to source 48, which is connected to a voltage dividing network of resistors in a multimeter, is shunted to ground, preventing damage to the sensitive circuit elements in the network and multimeter. As such, transistor 70 functions as a current amplifier, the load current through the transistor being dependent on the base current. As with the embodiment of circuit 30, if the bias voltage at base 74 is maintained at slightly less than or equal to the positive power supply voltage, $V_{DD}$, any input voltage greater than $V_{DD}$ will be shunted to ground through transistor 70. Collector 76 may alternately be coupled to the negative power supply, $V_{SS}$.

Similarly, when an input voltage, received at input terminal 34, causes emitter 82 of transistor 80 to be at a lower potential than the biasing voltage at base 84, transistor 80 will begin to conduct current and shunt the negative input voltage to input terminal 34. Transistor 80, like the transistor 70, acts as a current amplifier. As with the first embodiment, if the bias voltage at base 84 is maintained slightly greater than or equal to the negative power supply, $V_{SS}$, any input voltage less than $V_{SS}$ will be shunted to input terminal 34 through transistor 80. Collector 86 may alternately be coupled to a negative power supply, $V_{SS}$.

As with the first embodiment, either transistor 70 or 80, and its respective bias voltage source, may optionally be removed from circuit 60, if overvoltage protection is desired against excessive voltages of only one polarity. Circuit 60 may also be implemented using bipolar semiconductor fabrication technology.

It may be appreciated from the above disclosure that the various embodiments of the present invention each provide an overvoltage protection circuit which safely shunts input voltages having magnitudes which exceed those of the power supply in a manner which will not cause damage to the electronic circuit and which can be implemented readily using conventional semiconductor fabrication technology.

Accordingly, it will be appreciated that the detailed disclosure has been presented by way of example only and is not intended to be limiting. Various alterations, modifications and improvements will readily occur to those skilled in the art, and may be practiced without departing from the spirit and scope of the invention. For example, the exact values of bias voltage sources 48 and 58 will depend on the values of $V_{DD}$ and $V_{SS}$, respectively. Similarly, the value of input resistor 36 will be dependent on these exact specifications of the actual transistors implemented in circuits 30 and 60. Further, other circuit elements which function as current amplifiers may be substituted for the transistors of the present invention. Additionally, the inventive overvoltage protection circuit may be used to protect direct current power supplies which are not implemented with batteries and can be used to protect against excessive voltages which are generated either externally or internally of an apparatus. The invention is limited only as required by the following claims and equivalents thereto.

What is claimed is:

1. An electronic apparatus having a direct current power supply and an input terminal for receiving input voltages, said apparatus comprising:

a meter circuit, powered by said power supply, coupled to said input terminal and operable to measure an electrical quantity thereat;

a first bias voltage source, separate from said power supply, for supplying a control voltage having potential less than or equal to the power supply voltage;

a first current amplifier having a first terminal coupled to said input terminal, a second terminal coupled to a potential less than the control voltage, and a control terminal coupled to the first bias voltage source for controlling the conduction between the first and second terminals;

said current amplifier conducting current between the first and second terminals when the potential of an input voltage is greater than that of the first bias voltage source.

2. The apparatus of claim 1 wherein a resistive element is coupled intermediate said input terminal and the first terminal of said first current amplifier.

3. The apparatus of claim 1 wherein a resistive element is coupled intermediate said input terminal and the first terminal of said first current amplifier.

4. The apparatus of claim 1 wherein the first current amplifier comprises a transistor.

5. The apparatus of claim 4 wherein the transistor comprises a p-channel field effect transistor having a source terminal coupled to said input terminal and a drain terminal coupled to ground.

6. The apparatus of claim 2 wherein the transistor comprises a bipolar PNP transistor having an emitter terminal coupled to said input terminal and a collector terminal coupled to ground.

7. The apparatus of claim 1 wherein said said first-mentioned power supply is a positive direct current power supply and said apparatus further comprises:

a negative direct current power supply that also powers the meter circuit;

a second bias voltage source, separate from said negative power supply, for supplying a second control voltage greater than or equal to the negative power supply voltage; and a second current amplifier having a first terminal coupled to said input terminal, a second terminal coupled to a potential greater than the second control voltage and a control terminal coupled to the second bias voltage source for controlling the conduction between the first and second terminals of the second current amplifier.

8. The apparatus of claim 7 wherein the second current amplifier comprises a transistor.

9. The apparatus of claim 8 wherein said transistor comprises an n-channel field effect transistor having a source terminal coupled to said input terminal and a drain terminal coupled to ground.

10. The apparatus of claim 8 wherein said transistor comprises a bipolar NPN transistor having an emitter terminal coupled to said input terminal and a collector terminal coupled to ground.

11. An electronic apparatus having a positive direct current power supply and an input terminal for receiving input voltages, said protection circuit comprising:

a meter circuit, powered by said power supply, coupled to said input terminal and operable to measure an electrical quantity thereat;

a first bias voltage source, separate from said power supply, for supplying a control voltage having a potential less than or equal to the power supply voltage;

a first transistor having a first current carrying terminal coupled to said input terminal, a second current carrying terminal coupled to a potential less than the control voltage, and a control terminal coupled to the first bias voltage source, said transistor conducting current between the first and second current carrying terminals when the potential of an input voltage is greater than said control voltage.

12. The apparatus of claim 11 wherein the transistor comprises a p-channel field effect transistor having a source terminal coupled to said input terminal and a drain terminal coupled to ground.

13. The apparatus of claim 11 wherein the transistor comprises a bipolar PNP transistor having an emitter terminal coupled to said input terminal and a collector terminal coupled to ground.

14. The apparatus of claim 11 wherein said first-mentioned power supply is a positive direct current power supply and said apparatus further comprises:

a negative direct current power supply that also powers said meter circuit;

a second bias voltage source, separate from said negative power supply, for supplying a second control voltage greater than or equal to the negative power supply voltage, and a second transistor having a first current carrying terminal coupled to said input terminal, a second current carrying terminal coupled to a potential greater than the second control voltage, and a control terminal coupled to the second bias voltage source, said second transistor conducting current between the first and second terminals when the potential of an input voltage is greater than said second control voltage.

15. The apparatus of claim 14 wherein said transistor comprises an n-channel field effect transistor having a source terminal coupled to said input terminal and a drain terminal coupled to ground.

16. The apparatus of claim 14 wherein said transistor comprises a bipolar NPN transistor having an emitter terminal coupled to said input terminal and a collector terminal coupled to ground.

17. An electronic apparatus having a positive direct current power supply, a negative direct current power supply and an input terminal for receiving input voltages, said apparatus comprising:

a meter circuit powered by said positive and negative power supplies, coupled to said input terminal, and operable to measure an electrical quantity thereat;

a first bias voltage source, separate from said positive power supply, for supplying a first control voltage having a potential less than or equal to the positive power supply voltage;

a p-channel field effect transistor having a source terminal coupled to said input terminal, a drain terminal coupled to ground, and a gate terminal coupled to the first bias voltage source;

a second bias voltage source, separate from said negative power supply, for supplying a control voltage having a potential greater than or equal to the negative power supply voltage; and an n-channel field effect transistor having a source terminal coupled to said input terminal, a drain terminal coupled to ground, and a gate terminal coupled to said second bias voltage source.

18. An electronic apparatus having a positive direct current power supply, a negative direct current power supply and an input terminal for receiving input voltages, said apparatus comprising:

a meter circuit powered by said positive and negative power supplies, coupled to said input terminal, and operable to measure an electrical quantity thereat;

a first bias voltage source, separate from said positive power supply, for supplying a first control voltage having a potential less than or equal to the positive power supply voltage;

a bipolar PNP transistor having an emitter terminal coupled to said input terminal, a collector terminal coupled to ground, and a base terminal coupled to the first bias voltage emitter;

a second bias voltage source, separate from said negative power supply, for supplying a control voltage having a potential greater then or equal to the negative power supply voltage; and a bipolar NPN transistor having an emitter terminal coupled to said input terminal, a collector terminal coupled to ground, and a base terminal coupled to said second bias voltage emitter.

19. An electronic apparatus having a positive direct current power supply and a negative direct current power supply and an input terminal for receiving input voltages, the apparatus comprising:

a CMOS meter circuit powered by said positive and negative power supplies, coupled to said input terminal, and operable to measure an electrical quantity thereat;

a pair of complementary field effect transistors having their source terminals coupled to said input terminal and their drains connected to ground;

a first bias voltage separate from said positive power supply and having a potential less than or equal to the positive power supply voltage; and a second bias voltage source separate from said negative power supply and having a potential greater than or equal to the negative power supply voltage, said first bias voltage source coupled to the gate terminal or a first of said field effect transistors and said second bias voltage source coupled to the gate terminal of a second of said field effect transistors.

20. The apparatus of claim 19 wherein said first transistor is a p-channel field effect transistor and the second transistor is an n-channel field effect transistor.

21. The apparatus of any of claims 1, 11, 17, 18, or 19, wherein the meter circuit is a multimeter circuit and the input terminal is connected to a resistive switching network in the multimeter circuit.

22. An overvoltage protection circuit for use in an electronic apparatus having a direct current power supply and an input terminal for receiving input voltages, said protection circuit comprising:

a first bias voltage source for supplying a control voltage having a potential less than or equal to the power supply voltage; and a first current amplifier having
a first terminal coupled to receive an input voltage from said input terminal,
a second terminal coupled to a potential less than said control voltage, and
a control terminal coupled to receive said control voltage of the first bias voltage source, said amplifier so conducting current between the first and second terminals when the potential of the input voltage is greater than that of the control voltage of the first bias voltage source, as to clamp the input voltage received by the first terminal so that it does not provide a charging current to said power supply.

23. The overvoltage protection of claim 22 wherein said electronic apparatus includes a negative direct current power supply and wherein said overvoltage protection circuit further comprises:

a second bias voltage source for supplying a second control voltage greater than or equal to the negative power supply voltage; and a second current amplifier having
- a first terminal coupled to receive said input voltage from said input terminal,
- a second terminal coupled to a potential greater than said second control voltage, and
- a control terminal coupled to receive said second control voltage of the second bias voltage source, said second amplifier conducting current between the first and second terminals of the second current amplifier.

* * * * *